United States Patent
Onishi et al.

[11] Patent Number: 5,828,820
[45] Date of Patent: Oct. 27, 1998

[54] MIRROR DISK CONTROL METHOD AND MIRROR DISK DEVICE

[75] Inventors: Sakuyuki Onishi; Yuji Miwa, both of Nagoya, Japan

[73] Assignee: Mitsubishi Denki Kabushiki Kaisha, Tokyo, Japan

[21] Appl. No.: 503,936

[22] Filed: Jul. 19, 1995

[30] Foreign Application Priority Data

May 10, 1995 [JP] Japan .................................. 7-111610

[51] Int. Cl.⁶ ............................ G06F 11/08; G06F 11/20; G06F 12/02
[52] U.S. Cl. ........................ 395/182.04; 711/4; 711/162; 711/217; 711/218
[58] Field of Search ........................ 395/182.04, 182.05, 395/182.06, 427, 440, 441, 183.17; 364/238.4, 248.1, 236.2, DIG. 1, DIG. 2, 952.1; 711/4, 113, 114, 118, 162, 217, 218

[56] References Cited

U.S. PATENT DOCUMENTS

| | | | |
|---|---|---|---|
| 4,866,601 | 9/1989 | Dulac et al. ...................... | 364/236.2 X |
| 4,910,614 | 3/1990 | Arai et al. .................................. | 360/69 |
| 5,210,860 | 5/1993 | Pfeffer et al. ....................... | 395/183.18 |
| 5,321,826 | 6/1994 | Ushiro ..................................... | 395/425 |
| 5,511,227 | 4/1996 | Jones ........................................ | 395/829 |
| 5,553,230 | 9/1996 | Peteson et al. ......................... | 395/180 |
| 5,574,851 | 11/1996 | Rathunde ............................. | 395/182.05 |
| 5,596,708 | 1/1997 | Weber ................................. | 395/182.04 |

FOREIGN PATENT DOCUMENTS

| | | |
|---|---|---|
| HEI-3111928 | 5/1991 | Japan . |
| HEI-4155673 | 5/1992 | Japan . |
| HEI 4241016 | 8/1992 | Japan . |
| HEI-4312114 | 11/1992 | Japan . |
| HEI-5307445 | 11/1993 | Japan . |

*Primary Examiner*—Dieu-Minh Le
*Attorney, Agent, or Firm*—Sughrue, Mion, Zinn, Macpeak & Seas, PLLC

[57] ABSTRACT

There is provided by the present invention a mirror disk device, in which specific numbers identical to those written in disks and name of a drive used as for a master disk are recorded in a set-up memory incorporated therein, this data is compared to a specific number written in a disk to determine a master disk or to transfer data to a slave disk. In the mirror disk according to the present invention, ranges of specific numbers are discretely defined without any conflict according to switching positions of a rotary switch. A first specific number is decided within each of the ranges by a random function and then serial numbers subsequent to the first specific number are assigned as specific numbers. With this feature, it is possible to prevent effective data from being lost due to, for instance, instruction miss because of manual operation.

13 Claims, 10 Drawing Sheets

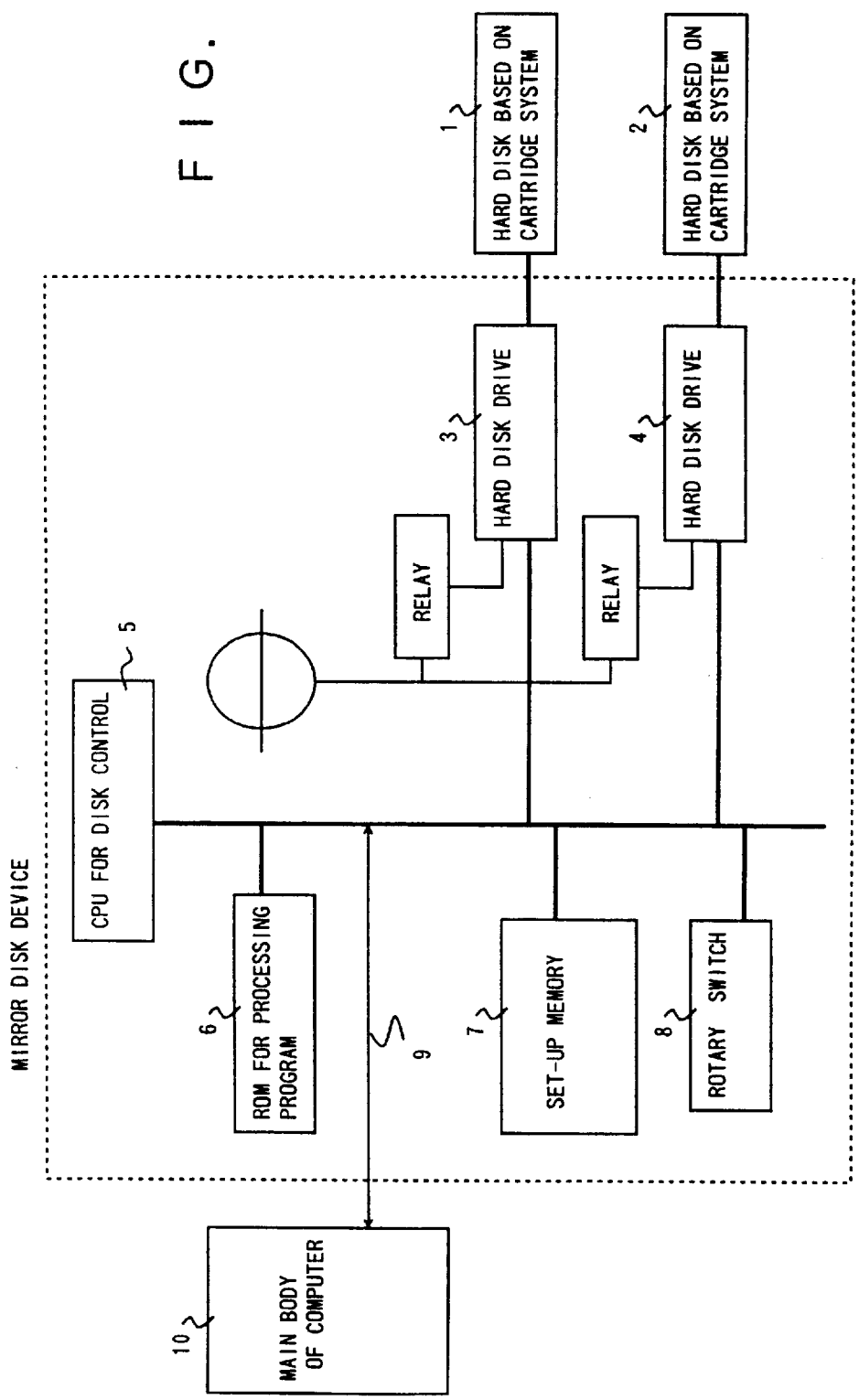

HARD DISK

BOOT RECORD

F I G. 7

| CASE | SPECIFIC NUMBER | | RUNNING STATE | | SET-UP MEMORY | | |
|---|---|---|---|---|---|---|---|
| | | | | | SPECIFIC NUMBER | | MASTER DRIVE NAME |
| | HARD DISK 1 | HARD DISK 2 | DISK DRIVE A | DISK DRIVE B | DISK DRIVE A | DISK DRIVE B | |
| 1 | α | β | ◎ | ○ | α | β | A |
| 2 | α | γ | ◎ | ◇→○ | α | β→NULL→γ | A |
| 3 | α | | ◎ | ☆→◇→○ | α | β→NULL→ε | A |
| 4 | α | NULL | ◎ | × | α | β→NULL | A |
| 5 | β | α | ◎ | ◇→○ | α→β | β→NULL→α | A |
| · | · | · | · | · | · | · | · |
| · | · | · | · | · | · | · | · |
| · | · | · | · | · | · | · | · |
| · | · | · | · | · | · | · | · |
| · | · | · | · | · | · | · | · |
| · | · | · | · | · | · | · | · |
| n | NULL | NULL | × | × | α→NULL | β→NULL | A→NULL |

×: OFF LINE BECAUSE ON DISK IS SET

◎: ONLINE OPERATION AS MASTER DISK

○: ONLINE OPERATION AS SLAVE DISK

◇: DATA TRANSFER FROM MASTER DISK

☆: INITIALIZATION BECAUSE CARTRIDGE SYSTEM DISK SET ON
  (SPECIFIC NUMBER WRITTEN IN OR FORMATTING)

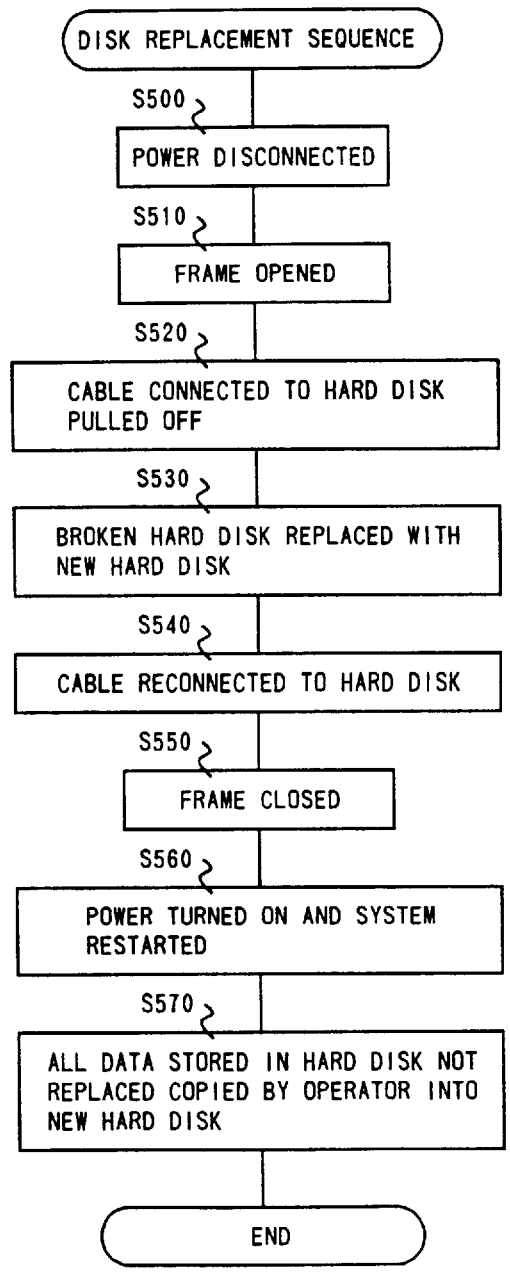

MIRROR DISK CONTROL METHOD AND MIRROR DISK DEVICE

FIELD OF THE INVENTION

The present invention relates to a mirror disk control method as well as a mirror disk device used in an FA controller or other various types of computer systems used for automation of a plant or for similar purposes, and more particularly to a mirror disk control method and a device set in a disk drive means so that a disk can be loaded on and off.

BACKGROUND OF THE INVENTION

A mirror disk device has, as shown in FIG. 8 and FIG. 9, two hard disks 51, 52 each set in a frame 50, the hard disks 51, 52 are connected through parallel cables 55, 56 to a hard disk interface 54 of a F/W 53, and the F/W 53 is connected through an interface 57 to is a CPU 58.

The F/W 53 shown in FIG. 9 is a Firmware controlling 2 units of disk device (generally a program stored in a ROM for controlling hardware). Namely, when accessing a disk, the CPU 58 issues an instruction through the I/F 57, and the F/W 53 executes such operations as disk management or disk copy (Refer to FIG. 4, FIG. 5, FIG. 6, FIG. 7, and FIG. 10).

In this mirror disk device, when the CPU 58 issues a write request through the interface 57 to the F/W 53, the F/W writes the same data in the hard disks 51 and 52 through the hard disk interface 54, thus mirroring being executed.

This type of mirror disk device has been disclosed, for instance, in Japanese Patent Laid Open Publication No. 111928/1991, Japanese Patent Laid Open Publication No. 155673/1992, Japanese Patent Laid Open Publication No. 241016/1992, Japanese Patent Laid Open Publication No. 312114/1992, and Japanese Patent Laid Open Publication No. 307445/1993.

In the mirror disk device described above, when one of the two hard disks breaks down, a disk replacement work is executed according to a flow chart shown in FIG. 10. In this disk replacement work, at first, power for a computer system is disconnected (step 500), the frame is opened (step 510), a cable connected to a hard disk is pulled off (step 520), the broken hard disk is removed and is replaced with a new hard disk (step 530), the cable pulled off is again connected (step 540), the frame is closed (step 550), and power is connected to restart the computer system (step 560). Then the computer system has a device number assigned to the disk device displayed, and an operator copies (transfers) all data from a hard disk not replaced to a new hard disk (step 570) to restore the mirroring state.

In the conventional type of mirror disk device, during data transfer work when a disk breaks down and is replaced with a new one is performed according to instructions given by an operator, sometimes effective data is lost or a large work load is required due to such errors as incorrectly specifying a copied disk or a copying disk or mistakes in key operations.

SUMMARY OF THE INVENTION

It is an object of the present invention to provide a mirror disk control method and a mirror disk device in which a master disk, namely a copied disk is clearly differentiated from a slave disk, namely a copying disk for enabling easy disk management, a malfunction in data transfer can be prevented. Furthermore the mirroring state can automatically be executed without requiring manual labor, loss of important data due to incorrect instructions from an operator can be eliminated, and there is no possibility of data loss.

In the mirror disk control method according to the present invention, a specific number is written for each disk set in a disk drive, the specific number and a disk drive working as a master disk are registered in a set-up memory, and a master disk and a slave disk are clearly differentiated from each other according to the contents registered in the set-up memory.

In the mirror disk control method according to the present invention, ranges of specific numbers each corresponding to a switching position of a rotary switch, are discretely set without any conflict. A first specific number is decided within the range by means of a random function and then serial numbers subsequent to the first specific number are assigned respectively. With these features, even if disks are replaced with those used in an equivalent mirror disk device, no identical specific number will be assigned to a plurality of disks.

In the mirror disk control method according to the present invention, a disk setting state in each disk drive is checked when power is turned ON, a master disk is automatically decided depending on a master disk drive name registered in the set-up memory, and then the mirroring operation is started. Because of these features, incorrect recognition of a master disk will never occur.

In the mirror disk control method according to the present invention, a specific number is read out from each of the disks set in the disk drives. Determination is made as to whether the specific number coincides with any of the specific numbers of the disks in the disk drives registered in a set-up memory, a disk having a specific number not coincident to any of the specific numbers for disks in the disk drives registered in the set-up memory is determined as a newly replaced disk. The disk is automatically determined as a slave disk and a disk having a specific number coincident to any of the specific numbers for disks is determined as a master disk. After this determination, all the data stored in the master disk is transferred to the slave disk, and the mirroring state is automatically restored.

In the mirror disk control method according to the present invention, when reading a specific number from a disk, if the disk does not have any specific number assigned thereto, the disk is formatted and a specific number is written in the disk; the specific number is written together with a disk drive name related to the specific number in a set-up memory. With this operation, a specific number is assigned without fail to a disk set in a disk drive.

In the mirror disk control method according to the present invention, when reading a specific number from a disk, if a disk having a specific number not coincident to any of those registered in the set-up memory has a specific number, contents of registration of a specific number of the disk in the set-up memory are changed to a specific number written in the disk to maintain consistency between a specific number written in a disk set in a disk drive and a specific number of the disk registered in a set-up memory.

In the mirror disk device according to the present invention, a specific number is assigned by a disk control means to each of the disks set in the disk drives. The specific number and a disk drive working as a master disk are registered in the set-up memory. With these features, a master disk and a slave disk are clearly differentiated from each other.

In the mirror disk device according to the present invention, ranges of specific numbers are discretely defined without any conflict according to switching positions of a rotary switch. A first specific number is decided within each of the ranges by means of a random function and then serial numbers subsequent to the first specific number are assigned as specific numbers. With these features, even if a disk is replaced by a disk used in another equivalent mirror disk device, an identical specific number will never be assigned to a plurality of disks.

In the mirror disk device according to the present invention, a disk setting state in each disk drive is checked by a disk control means when power is turned ON. A master disk is automatically decided depending on a master disk drive name registered in the set-up memory and then the mirroring operation is started. With these features, incorrect recognition of a master disk will never occur during the mirroring operation.

In the mirror disk device according to the present invention, specific numbers are read out by the disk control means from each of the disks set in the disk drives respectively. A disk having a specific number not coincident to a specific number of a disk in each disk drive registered in the set-up memory is determined as a newly replaced one. The disk is then determined as a slave disk. The other disk, having a specific number coincident to any of the specific numbers registered in the set-up memory, is automatically determined as a master disk; data is transferred from the master disk to the slave disk and the mirroring state is restored.

In the mirror disk device according to the present invention, when reading a specific number from a disk, if the disk does not have any specific number, the disk is formatted by a disk control means. A sequence of writing a specific number in the disk and also writing the specific number together with a disk drive name related to a disk drive name in a set-up memory is automatically executed. These features provide a specific number assigned without fail to each of the disks set in the disk drives.

In the mirror disk device according to the present invention, when reading a specific number from a disk, if a disk has a specific number but the specific number is not coincident to any of those registered in the set-up memory, contents of registration of the specific number of the disk in the set-up memory are changed by the disk control means to a specific number written in the disk. This feature provides automatically maintained consistency between a specific number written in a disk positioned in a disk drive and a specific number of the disk registered in a set-up memory.

Other objects and features of this invention will become understood from the following description with reference to the accompanying drawings.

BRIEF DESCRIPTION OF THE DRAWINGS

FIG. 1 is a block diagram illustrating an embodiment of a mirror disk device according to the present invention;

FIG. 7 is a chart illustrating specific numbers of disks and state shift in a set-up memory in the mirror disk device according to the present invention;

FIG. 10 is a flow chart illustrating a disk replacement sequence in a mirror disk device based on the conventional technology.

DESCRIPTION OF THE PREFERRED EMBODIMENTS

Figure 2A:
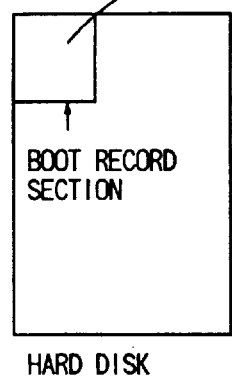
FIGS. 2A to 2C are memory maps in a hard disk in the mirror disk device according to the present invention.

A detailed description is made hereinafter for embodiments of the present invention with reference to the related drawings.

FIG. 1 shows an embodiment of a mirror disk device according to the present invention. This mirror disk device comprises a hard disk 1, based on a cartridge system from which data can be read out or into which data can be written; two hard disk drives 3, 4, each based on a cartridge system in which the hard disks 1 and 2 are each based on a cartridge system enabling data read therefrom and data written thereto are replaceably set; CPU 5 for disk control; a ROM 6 for processing program in which a processing program with a data transfer sequence or the like described therein; a set-up memory 7 comprising a non-volatile memory; and a rotary switch 8. The mirror disk device is connected through a host interface 9 to a main body of a computer system 10.

The hard disks 1, 2, each based on a cartridge system, are assigned to a memory area in which mirror disk data, including a specific number, is written respectively.

Figure 2B:
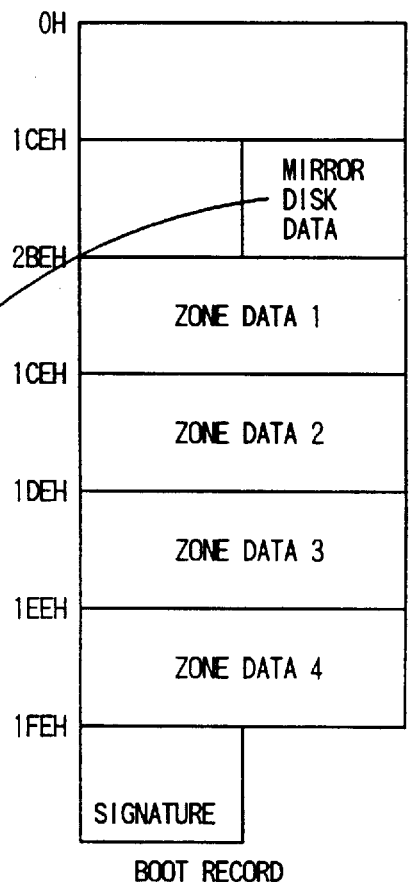
Figure 2C:
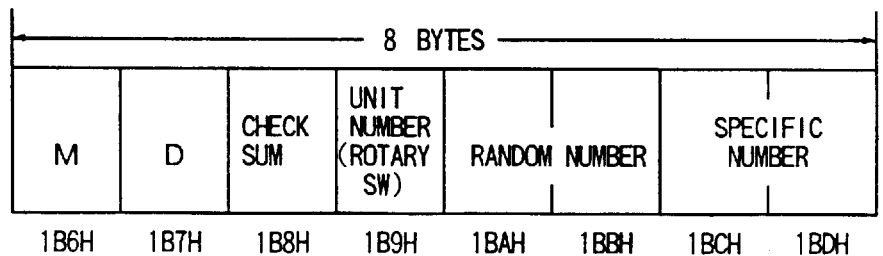

FIGS. 2A to 2C show a memory map of this hard disk respectively. The mirror disk data is written in an eight-byte space from address "1B6H" to address "1BDH" before the zone data within a boot record section of the hard disk.

Written data is written as follows; namely 'M' at address "1B6H"; 'D' at address "1B7H", check sum at address "1B8H"; a unit number set by a rotary switch 8 at address "1B9H"; a random number, which is a specific number generated through a random function by a mirror disk device at addresses "1BAH" and "1BBH"; and specific numbers of the hard disks at address "1BCH" and "1BDH".

The set-up memory 7 stores therein specific numbers assigned to the hard disks 1,2 positioned in the hard disk drives 3, 4, and the name of a disk drive functioning as a master disk.

Herein, a drive name for a hard disk drive 3 is defined as A and a drive name for a hard disk drive 4 as B. It should be noted that, sometimes the hard disk drive 3 is called a disk drive A and a hard disk drive 4 is called a disk drive B when calling each hard disk drive with the drive name.

Figure 3:
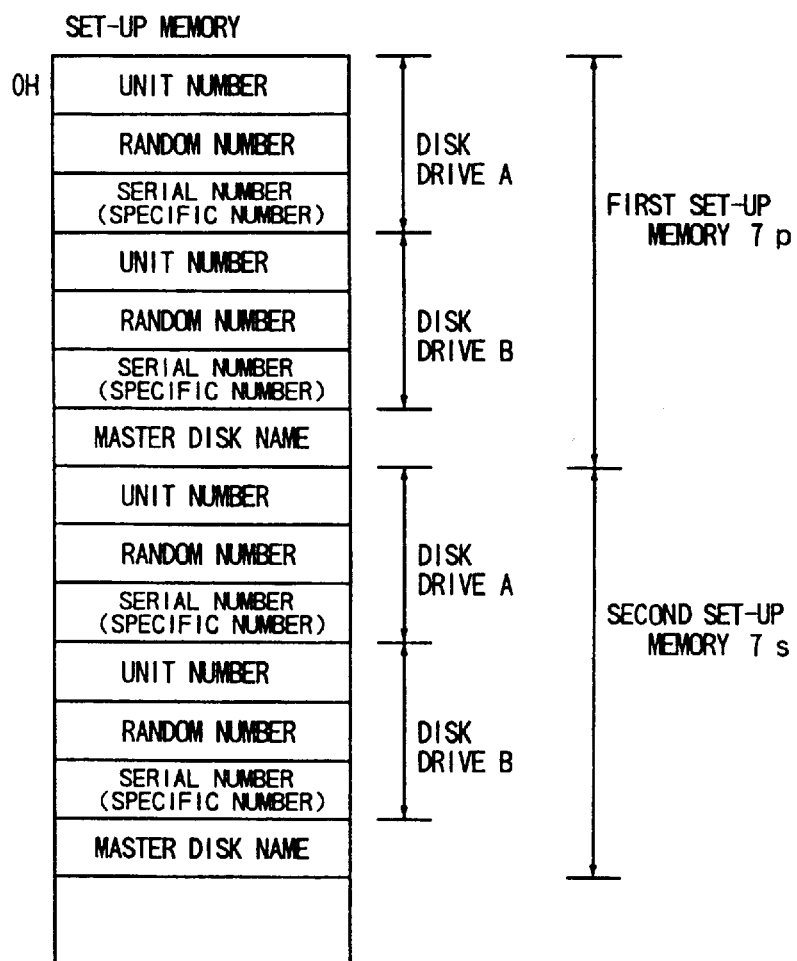
FIG. 3 is a memory map in a set-up memory in the mirror disk device according to the present invention.

FIG. 3 shows a memory map in the set-up memory 7. The set-up memory has a first set-up memory section 7p and a second set-up memory section 7s. The first set-up memory section 7p and the second set-up memory 7s have the same configuration each having a memory area in which data for the disk drive A or data for the disk drive B is written. Unit numbers, random numbers, and serial numbers (specific numbers) written in the hard disks 1, 2 set in the disk drives are also written in the memory area in which data for the disk drive A or data for the disk drive B is written.

As a master disk name, the name of a disk drive working as a master disk in the mirror disk device is recorded.

During a sequence of writing a specific number, when a hard disk based on a cartridge system is replaced with a new one in a mirror disk device, the CPU 5 for disk control first rewrites the first set-up memory 7p according to a processing program stored in the ROM 6 for processing program. Next the disk control CPU 5 rewrites the mirror disk data in a hard disk based on a cartridge system. Next the disk control CPU 5 rewrites the second set-up memory 7s and terminates the operating sequence when the contents of the first set-up memory 7p become coincident to the contents of the second set-up memory 7s.

The rotary switch 8 is constructed so that the rotary switch can be switched to any of a plurality of switching positions. The disk control CPU 5 sets a unit number according to a switching position and discretely sets a range for each specific number at each switching position without any conflict. Then the disk control CPU 5 selects a first specific number from ranges specified by the rotary switch 8 by means of a random function. The disk control CPU 5 then assigns a serial number subsequent to the first specific number as a specific number for each hard disk.

Thus, the disk control CPU 5: generates specific numbers without any conflict; writes a specific number on the hard disk 1 or 2 based on a cartridge system newly installed in the disk drive 3 or 4; writes the specific number together with a disk drive name related to the specific number in the set-up memory 7; determines a disk drive working as a master disk; and writes the disk drive name in the set-up memory 7.

Next, a description is made for the necessity of the rotary switch 8 described above. In a mirror disk device according to the present invention, the CPU 5 for disk control checks a master disk drive name recorded in the set-up memory 7, a specific number of a hard disk installed in each of the disk drives, and a specific number registered in each hard disk itself. The CPU 5 for disk control makes one of the disks work as a master disk and another as a slave disk. A specific number is decided by means of a random function. A specific number is decided only when the mirror disk is used for the first time so as to prevent hard disks having the same specific number from being set in the disk drives which would cause loss of control of the mirror disk. Subsequent to the first use of the mirror disk, a value obtained by adding 1 to the specific number decided previously is used as a new specific number.

However, if a plurality of mirror disk devices are used at the same site and a hard disk with a specific number written by the other mirror disk device is used, there is the possibility that hard disks having the same specific number simultaneously be set in disk drives in a single mirror disk device.

To prevent this type of mis-operation, the rotary switch 8 is set to have a number of switching positions greater than the number of switching positions of the rotary disk switch 8 of the other mirror disk devices which might be used at the same time. Additionally, a range of specific numbers is provided for each mirror disk device according to a unit number decided by the number of switching positions.

Thus it is possible to prevent a mirror disk device from becoming uncontrollable. The CPU 5 for disk control checks, when power is turned ON, the setting state of the hard disks 1, 2 in the disk drives 3, 4, decides a master disk depending on a master disk drive name registered in the set-up memory 7, and starts the mirroring operation.

Also, the disk control CPU 5 reads, when a disk is replaced with a new one, specific numbers from the hard disks 1, 2 set in the disk drives 3, 4, compares the specific numbers to specific numbers of the hard disks set in the disk drives 3, 4 registered in the set-up memory 7, determines whether a disk not having a specific number coincident to any of the registered specified numbers is a newly replaced one, and transfers data from the other hard disk to the newly replaced hard disk.

When replacing a hard disk, if a hard disk determined as a newly replaced one does not have any specific number, the disk control CPU 5 formats the hard disk and writes a specific number in this hard disk. The disk control CPU 5 also writes the specific number together with a disk drive name related to the specific number. Alternatively, if the hard disk determined as a newly replaced one has a specific number, the disk control CPU 5 changes a specific number of the hard disk to be registered in the set-up memory 7 to the specific number written in the hard disk.

In the mirror disk device according to the present invention, the CPU 5 for disk control identifies either one of the hard disks 1, 2 set in the disk drives 3, 4 as a master disk according to contents registered in the set-up memory 7. The CPU 5 for disk control reads data from or writes data into the main body of computer 10 and realizes a mirroring state using the other hard disk as a slave disk in which the same contents as those in the master disk are written.

Next, a description is made for operations in the embodiment described above with reference to FIG. 4 to FIG. 6.

Figure 4:
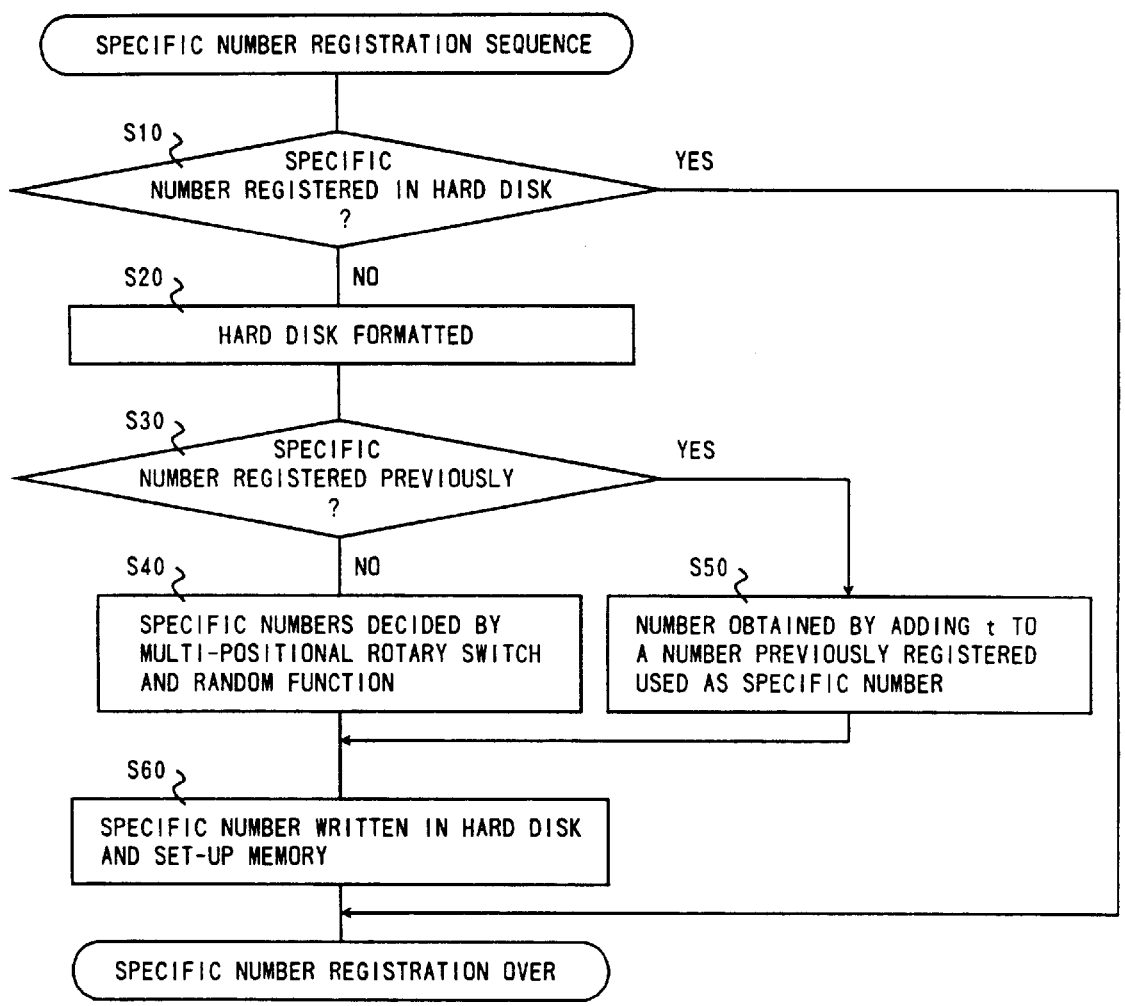
FIG. 4 is a flow chart illustrating a sequence for registering a specific number of a disk in the mirror disk device according to the present invention.

The flow in FIG. 4 shows a sequence for registering a specific number. In the specific number registration sequence, first determination is made as to whether a specific number has been registered at a specified memory address of the hard disk (HD) 1 or 2 (step 10). If it is determined that a specific number has been registered (step 10, affirmation), the specific number registration sequence is terminated.

On the contrary, if a specific number has not been registered (step 10, negation), the CPU 5 for disk control formats the hard disk 1 or 2 (step 20), and determines whether the mirror disk device has ever registered any specific number, namely whether the mirror device has ever generated a first specific number by means of a random function (step 30).

If the mirror disk device has never registered a specific number (step 30, negation), the mirror disk device decides a first specific number from those each corresponding to a range specified by the rotary switch 8 by means of a random function (step 40). In contrast, if the mirror disk device has ever registered a specific number (step, affirmation), the mirror disk device decides a number obtained by adding 1 to the specific number registered last as a specific number (step 50).

Once a specific number is decided described above, the specific number is written in specified area of the hard disk 1 or 2 as well as in specified area of the set-up memory 7 (step 60), the specific is number registration sequence terminated.

With this operation, a specific number is assigned to each disk set in a disk drive, and the specific number is registered in a set-up memory.

Figure 5:
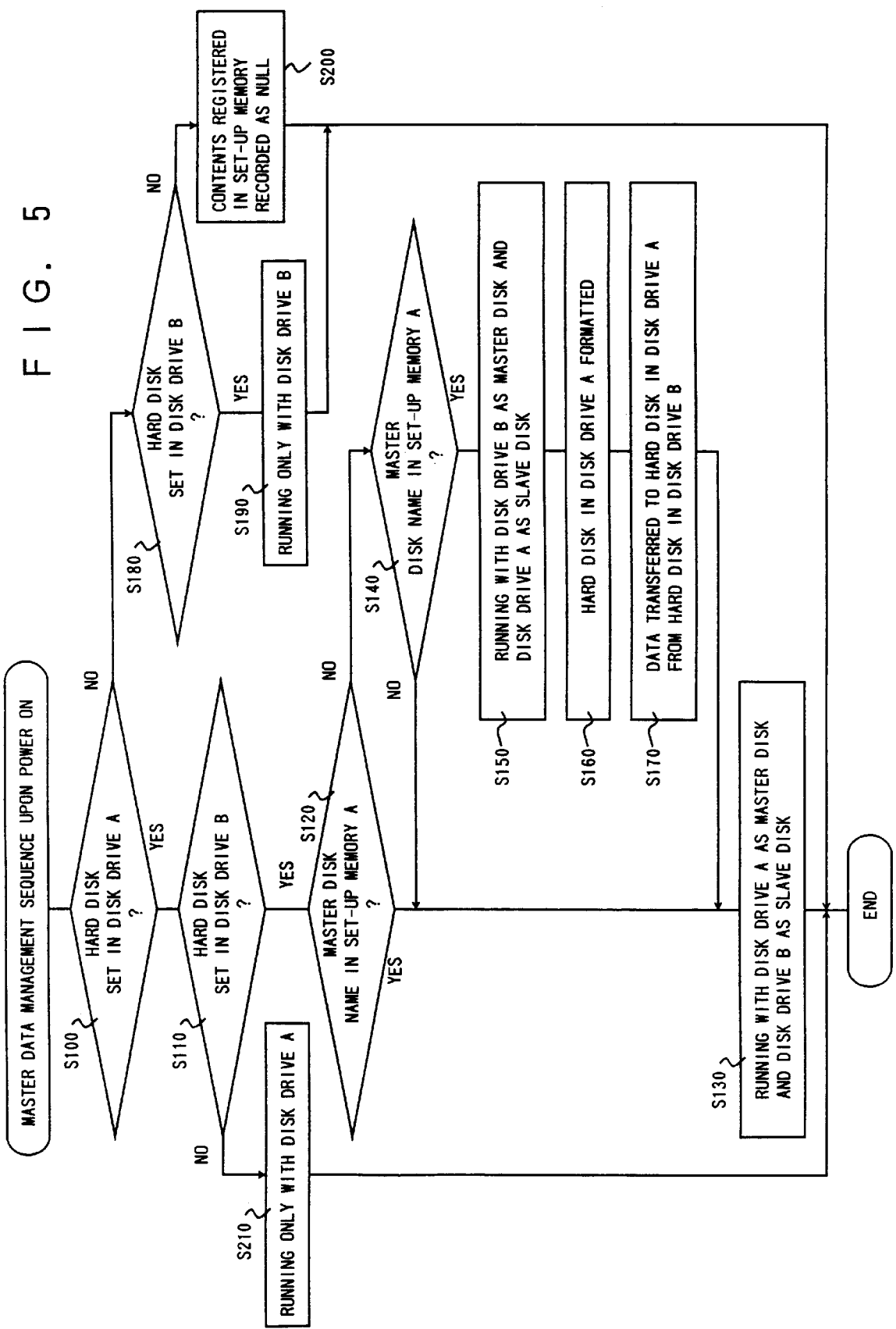
FIG. 5 is a flow chart illustrating a master disk management sequence when power is turned ON in the mirror disk device according to the present invention.

The flow in FIG. 5 shows a master disk management sequence when power is turned ON. This master disk management sequence is executed when power for a computer system is turned ON. First, determination is made as to whether the hard disk 1 has been set in the disk drive A or not (step 100). If it is determined that the hard disk 1 has been set in the disk drive A (step 100, affirmation), then determination is made as to whether the hard disk 2 has been set in the disk drive B or not (step 110).

If it is determined that the hard disk 1 has been set in the disk drive B (step 110, affirmation), determination is made as to whether the master disk name registered in the set-up memory 7 is for the disk drive A or not (step 120).

If the master disk name is for the disk drive A (step 120, affirmation), the disk drive A is decided as a master disk, and the disk drive B is decided as a slave disk. On the contrary, if it is determined that the master disk name registered in the set-up memory 7 is not for the disk drive A (step 120, affirmation), then determination is made as to whether is the master disk name registered in the step-up memory 7 is for the disk drive B or not (step 140).

If the master disk name is not for the disk drive B (step 140, negation) operation goes to step 130, and the disk drive A is decided as a master disk and the disk drive B as a slave disk.

If the master disk name is for the disk drive B (step 140, affirmation), then the disk drive B is decided as a master disk, and the disk drive A is decided as a slave disk (step 150).

Then the hard disk 1 set in the disk drive A is formatted (step 160), data is transferred from the hard disk 2 set in the disk drive B to the hard disk 1 set in the disk drive A (step 170), and then operation goes to step 130, and the disk drive A is decided as a master disk while the disk drive B is decided as a slave disk.

It should be noted that if the hard disk 1 has not been set in the disk drive A (step 100, negation), then determination is made as to whether the hard disk 2 has been set in the disk drive B (step 180). If the hard disk 2 has been set in the disk drive B (step 180, affirmation), the mirror disk device works only with the disk drive B (step 190). On the contrary, if the hard disk 2 has not been set in the disk drive B, contents of the set-up memory are recorded as null and the operating sequence is terminated (step 200). Also in step 110, if it is determined that the hard disk 2 has not been set in the disk drive B (step 110, negation), the mirror disk device works only with the disk drive A (step 210).

With this operation, the setting state of the hard disks 1, 2 in the disk drives A, B is checked, a master disk is automatically and appropriately set according to the hard disk setting state, and under the normal operating conditions data transfer is automatically executed between the hard disks 1, 2 so that the disk drive A is decided as a master disk. Thus the mirroring state is obtained with the disk drive A as a master disk.

Figure 6:
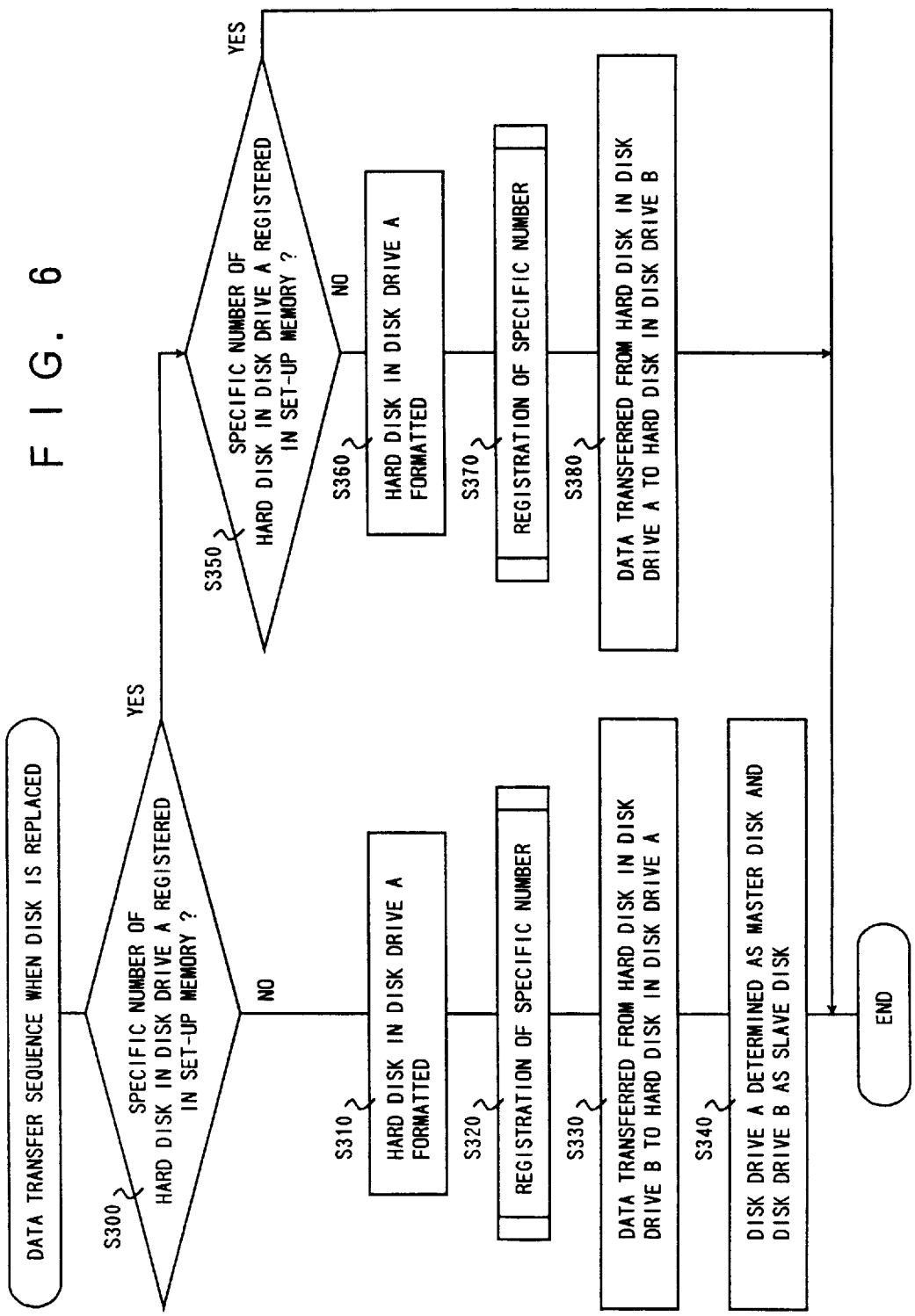
FIG. 6 is a flow chart illustrating a data transfer processing sequence when a disk is replaced with a new one in the mirror disk device according to the present invention.
Figure 8:
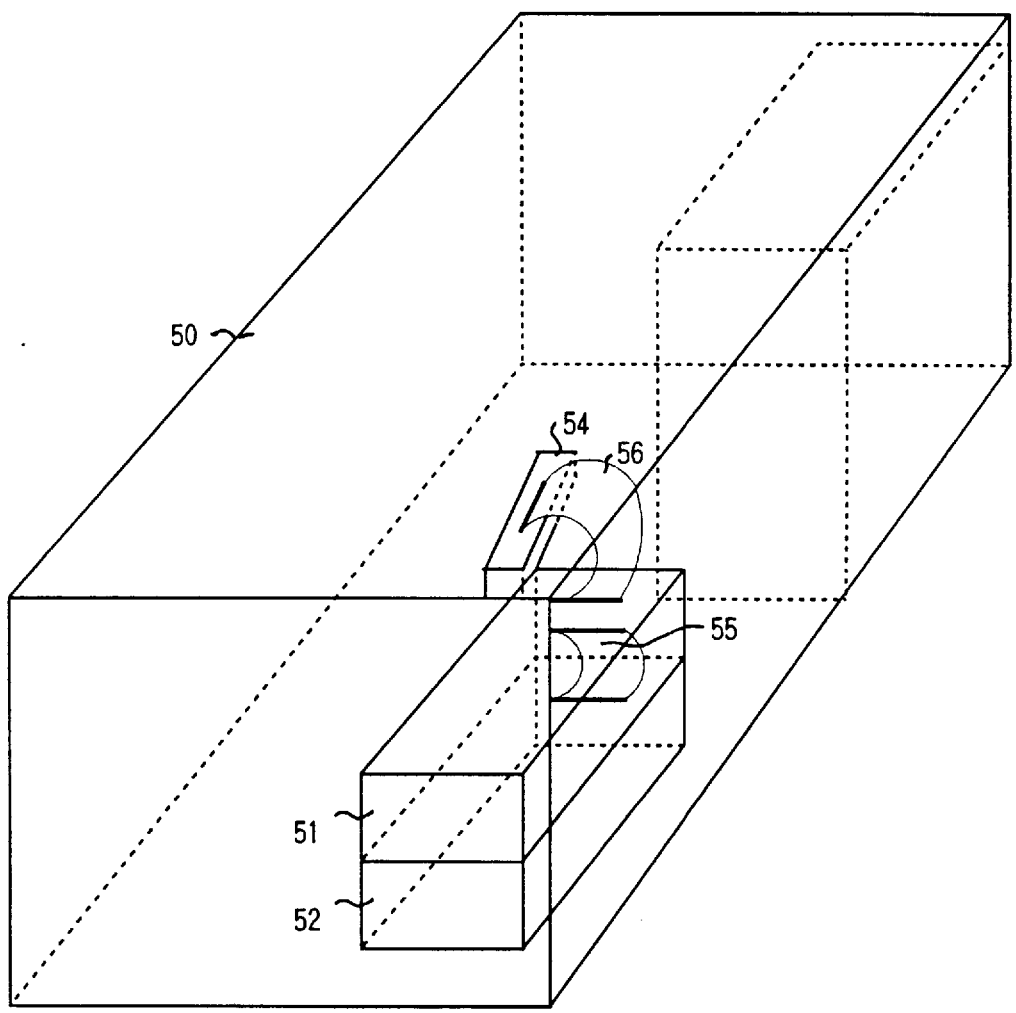
FIG. 8 is a perspective view illustrating a mirror disk device based on the conventional technology.
Figure 9:
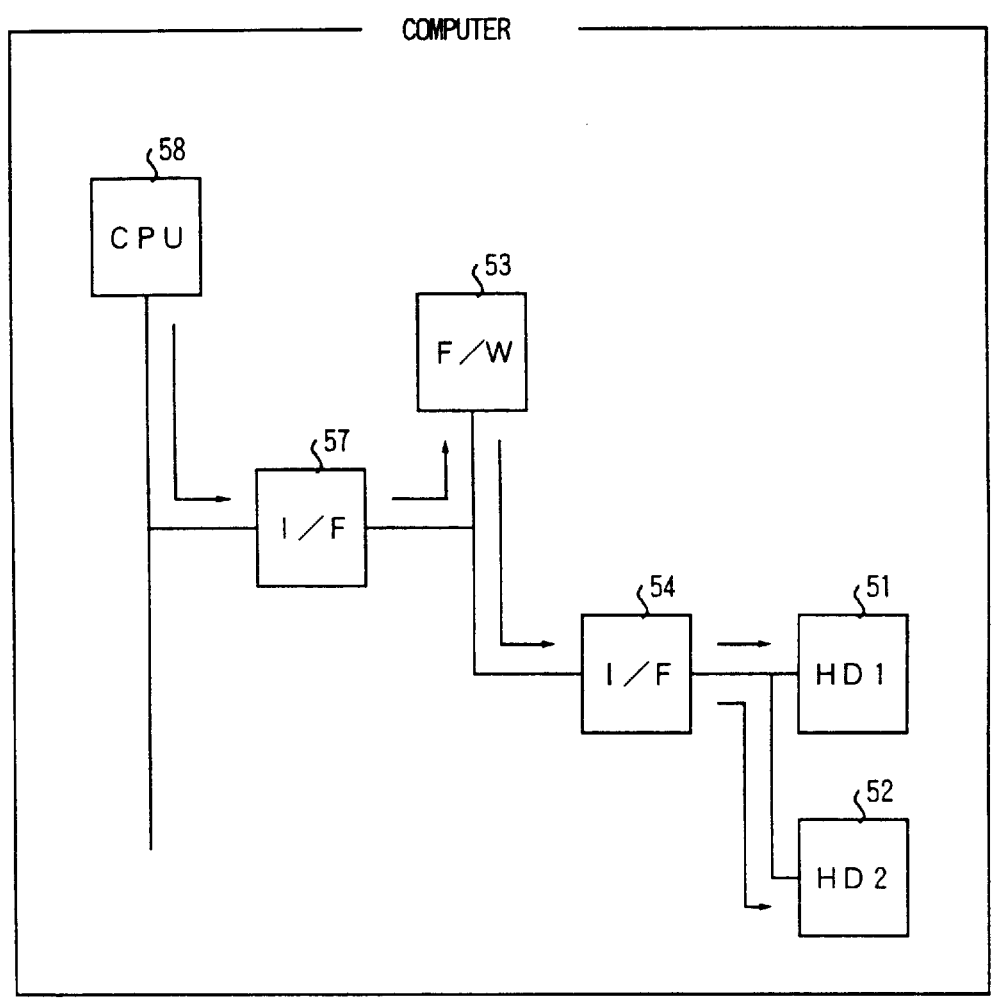
FIG. 9 is a block diagram illustrating a mirror disk device based on the conventional technology.

A flow in FIG. 6 shows a processing sequence for data transfer when a disk is replaced with a new one. When a problem occurs in either the hard disk 1 or the hard disk 2 in a mirror disk device and the faulty hard disk is replaced with a new one, at first determination is made as to whether a specific number of the new hard disk 1 set in the disk drive A has been registered in the set-up memory 7 or not (step 300).

If the specific number has not been registered in the new hard disk 1 (step 300, negation), the new hard disk 1 set in the disk drive A is formatted (step 310), and a specific number is registered according to a sequence shown in FIG. 4 (step 320). Then data stored in the hard disk 2 set in the disk drive B is transferred to the hard disk 1 set in the disk drive A (step 330), the disk drive A is identified as a master disk, the disk drive B is identified as a slave disk (step 340), and data transfer is terminated when a hard disk is replaced with a new one.

On the contrary, if a specific number has been registered in the hard disk 1 (step 300, affirmation), then determination is made as to whether a specific number of the hard disk 2 set in the disk drive B has been registered in the set-up memory 7 or not (step 350).

If a specific number has been registered in the hard disk 2 (step 350, affirmation), data transfer is terminated when a hard disk is replaced with a new one. If the specific number has not been registered in the hard disk 2 (step 350, negation), the hard disk 2 set in the disk drive B is formatted (step 360), and the specified number is registered according to the sequence shown in FIG. 4 (step 370). Then data stored in the hard disk 1 set in the disk drive A is transferred to the hard disk 2 set in the disk drive B (step 380), and data transfer is terminated when a hard disk is replaced with a new one.

With this operation, specific numbers written in the hard disk 1, 2 set in the disk drives A, B are compared to specific numbers of the disk drives A, B registered in the set-up memory 7. Whether registration of specific numbers is required or not is determined by referring to a result of this comparison. New specific numbers are automatically written in the hard disks 1, 2 or specific numbers registered in the set-up memory 7 are automatically updated so that the specific numbers written in the hard disks 1, 2 will coincide with the specific numbers of the disk drives A, B registered in the set-up memory 7. Data transfer between the hard disks 1, 2 is automatically executed so that the disk drive A will be able to work as a master disk, and the mirroring state is automatically restored with the disk drive A as a master disk.

The chart in FIG. 7 illustrates the change of specific numbers registered in the set-up memory 7 as well as those in the hard disks 1, 2 based on a cartridge system in association with change in a state of a mirror disk device.

This chart shows contents of the set-up memory when power is turned ON, wherein a specific number of the hard disk 1 set in the disk drive A is $\alpha$, a specific number of the hard disk 2 set in the disk drive B is $\beta$, and the master disk name is disk drive A.

Case 1 shows a state where the hard disk 1 having a specific number of a has been set in the disk drive A and the hard disk 2 having a specific number of $\beta$ has been set in the disk drive B. In this case, as the specific numbers of the hard disks 1, 2 coincide with those registered in the set-up memory 7, no change occurs and the disk drive A works as a master disk, while the disk drive B works as a slave disk.

Case 2 shows a state where the hard disk 1 having a specific number of $\alpha$ has been set in the disk drive A and the hard disk 2 having a specific number of $\gamma$ has been set in the disk drive B. In this case, the specific number of the hard disk 2 set in the disk drive B does not coincide with a specific number of the disk drive B registered in the set-up memory 7. Therefore, the hard disk 2 set in the disk drive B works as a slave disk after data is transferred from the disk drive A, as a master disk. In association with this operation, the specific number of the disk drive B set in the set-up memory 7 is changed to null and subsequently changed to $\gamma$.

As the specific number of the hard disk 1 set in the disk drive A coincides with the specific number of the disk drive A registered in the set-up memory 7, no change occurs, and the disk drive A works as a master disk.

Case 3 shows the state where a hard disk 1 having a specific number of $\alpha$ has been set in the disk drive A and the hard disk 2 having an unknown specific number has been set in the disk drive B. In this case, as the specific number of the hard disk 2 set in the disk drive B is unknown, this hard disk 2 is formatted, data is transferred from a master disk to this hard disk 2, and the hard disk 2 works as a slave disk. In association with this operation, the specific number of the disk drive B registered in the set-up memory 7 is changed to null, and subsequently changed to $\epsilon$.

Also in this case, as the specific number of the hard disk 1 in the disk drive A coincides with the specific number of the disk drive A registered in the set-up memory 7, no change occurs and the disk drive A works as a master disk.

Case 4 shows the state where the hard disk 1 having a specific number of a has been set in the disk drive A but the hard disk 2 has not been set in the disk drive B. In this case, the disk drive A independently works as a master disk and the specific number of the disk drive B registered in the set-up memory 8 is changed to null.

Case 5 shows the state where the hard disk 1 having a specific number of β has been set in the disk drive A and the hard disk 2 having a specific number of α has been set in the disk drive B. In this case, the hard disk A works as a master disk, and after data is transferred from a master disk, the disk drive B works as a slave disk. Then a specific number of the disk drive A registered in the set-up memory 7 changes from α to β and the specific number of the disk drive B is changed from β to null and subsequently changed to α.

Case n shows the state where hard disks 1, 2 have not been set in either of the disk drive A or the disk drive B. In this case, all of the specific numbers of the disk drives A, B registered in the set-up memory 7 and the master disk name are changed to null.

It should be noted that, in this embodiment, a disk is an auxiliary storage device enabling data read therefrom and data written thereto. The disk is a hard disk based on a cartridge system and the hard disk may be changed to other replaceable auxiliary storage devices such as an electrophoto-magnetic disk, an IC memory card, or a floppy disk.

For instance, if a floppy disk is used as an auxiliary storage device, the hard disk drives 3, 4 should be changed to floppy disk drives.

As described above, in a mirror disk control method according to the present invention, a specific number is written in each disk installed in the disk drives. The specific number and the designation of a disk drive as a master disk are registered in the set-up memory so that a master disk can clearly be differentiated from a slave disk according to the registered data. With these features, disk management can be executed easily as well as reliably and a malfunction in data transfer for mirroring can be prevented.

In a mirror disk control method according to the present invention, ranges, each having a specific number corresponding to a switching position of a rotary switch, can be arranged discretely without any conflict. A first specific number is decided within the ranges by means of a random function. Then serial numbers subsequent to the first specific number are assigned as specific numbers within the ranges respectively. Therefore, even if a disk is replaced with a new one from another mirror disk device at the same level, disks with the same specific number do not exist. As a result, the problem of having two disks with the same specific number installed in a mirror disk device at the same time is avoided beforehand; this prevents a malfunction in data transfer and a runaway of a computer system can be prevented.

In a mirror disk control method according to the present invention: a mounting state of a data in each disk drive is checked when power is turned ON; a master disk is automatically identified depending on a master disk drive name registered in the set-up memory; and subsequently a mirroring operation is started so that an error in specifying a master disk and the other disk does not arise. Loss of data caused by damaging events such as a fire or the like is prevented by means of replacing one disk with a new one and storing the removed disk in another place before starting a computer system.

In a mirror disk control method according to the present invention: specific numbers are read from disks installed in the disk drives respectively; a disk having a specific number not matching any of the disk-specific numbers in each disk drive registered in the set-up memory is identified as a newly replaced disk and is automatically identified as a slave disk. On the other hand, a disk matching disk-specific numbers is identified as a master disk; after this identification is made, the mirroring state can automatically be restored by transferring all data from the master disk to a slave disk. Therefore, restoring the mirroring state does not require manual labor; this feature reliably avoids loss of important data due to incorrect instructions such as an error in specifying a copied disk and a copying disk.

In a mirror disk control method according to the present invention, when reading specific numbers from disks, if a disk does not have any specific number, the disk is formatted; then a new specific number is written in the disk, the specific number is written together with a disk drive name related to the specific number in the set-up memory so that a specific number is always assigned to a disk installed in a disk drive. Also, formatting is automatically executed and all data is automatically transferred from a master disk to a new disk, which eliminates work by manual labor in restoring the mirror state.

In a mirror disk control method according to the present invention when reading specific numbers from disks, if a disk determined as a newly replaced one has a specific number, registered data for a specific number of the disk in set-up memory is changed to a specific number already written in the disk; then matching a specific number written in a disk set in a disk drive with a specific number of the disk registered in set-up memory can be maintained so that management of mirroring such as data transfer processing can be executed easily as well as reliably.

In a mirror disk control method according to the present invention, a specific number is assigned to each disk set in a disk drive by means of a disk control means. The disk control means is realized by a CPU which executes a processing program. The specific number and a disk drive as a master disk are registered in set-up memory, so that a master disk can clearly be differentiated from a slave disk. From this feature, disk management can be executed easily as well as reliably and a malfunction in data transfer for mirroring can be prevented.

In a mirror disk control method according to the present invention, ranges for a specific number according to switching positions of a rotary switch are set discretely without any conflict. The disk control means within the ranges decides a first specific number by means of a random function; then serial numbers subsequent to the first specific number are assigned as specific numbers within the ranges above; even if a disk is replaced by a new disk from another mirror disk drive at the same level, a disk having the same specific number as that in other disks does not exist. Two disks having the same specific number is set in one mirror disk drive at the same time is avoided beforehand. Also, a malfunction in data transfer due to matching a specific number or a runaway of a computer system can be prevented.

In a mirror disk control method according to the present invention, a disk control means checks a mounting state of a disk in each disk drive is checked when power is turned ON and a master disk is automatically decided depending on a master disk drive name registered in the set-up memory; then a mirroring operation is started so that an error in specifying a master disk and the other disk does not arise in a mirroring operation. Loss of data due to damaging events such as a fire or the like can be prevented by means of replacing one of the two disks for starting a computer system with the other one and storing the removed disk in another place.

In a mirror disk control method according to the present invention, specific numbers are read from disks installed in the disk drives respectively with a disk drive means. When a disk is replaced with another disk due to a breakdown of a disk, a disk having a specific number not matching any of the specific numbers of the disks in each disk drive registered in the set-up memory is identified as a replaced disk. It is automatically judged that the replaced disk is a slave one and the other one is a master disk; then all data is transferred from the master disk to a slave disk and restoring the mirroring state is automatically executed. The features eliminate the need for work by manual labor for restoring a mirroring state; also loss of important data due to incorrect instructions such as an error in specifying a copied disk and a copying disk can be reliably avoided. In a mirror disk control method according to the present invention when reading specific numbers from disks, if a disk does not have a specific number, a sequential processing where the disk control means formats the disk, writes a specific number in the disk and also writes the specific number together with a disk drive name related to the specific number in the set-up memory is automatically executed. These features enable a specific number to be assigned to a disk installed in a disk drive, formatting to be automatically executed, and all data to be automatically transferred from a master disk to a new one; then work by manual labor can be eliminated when restoring the mirroring state.

In a mirror disk control method according to the present invention when reading specific numbers from disks, if a disk is identified as a newly replaced one has a specific number, registered data for the specific number of the disk in the set-up memory is changed to a specific number written in the disk; therefore, matching the specific number written in the disk set in a disk drive with the specific number in the disk registered in the set-up memory is automatically maintained and management of mirroring such as data transfer processing, can be executed easily as well as accurately.

Although the invention has been described with respect to a specific embodiment to provide a complete and clear disclosure, the appended claims are not to be thus limited but are to be construed as embodying all modifications and alternative constructions that may occur to one skilled in the art which fairly fall within the basic teaching herein set forth.

What is claimed is:

1. A mirror disk control method for writing the same data in two disks installed in two disk drive means so that each of said disks can be replaced, comprising the steps of:

writing a disk-specific number in a disk newly set in said disk drive means;

writing the disk-specific number with a name of the corresponding disk drive means in a set-up memory;

identifying a disk functioning as a master disk in one of said two disk drive means; and writing the disk drive means name in said set-up memory;

discretely arranging a plurality of ranges without conflict between each of the ranges, each range having a disk-specific number corresponding to a switching position of a switch;

deciding a first disk-specific number from the plurality of ranges by means of a random function;

assigning serial numbers subsequent to the first disk-specific number and within each range of plurality of ranges as disk-specific numbers of each of the plurality of ranges.

2. A mirror disk control method according to claim 1, further comprising the steps of:

reading the disk-specific numbers from each of said disks positioned in said corresponding disk drive means;

comparing the disk-specific number read from each disk with a disk-specific number previously registered in said set-up memory as the disk-specific number of the disk in each of the respective disk drive means;

identifying a new disk as a disk having a disk-specific number not matching any of said disk-specific numbers previously registered in said set-up memory; and writing data stored on the master disk to the new disk.

3. A mirror disk control method according to claim 2, wherein, when the step of identifying a new disk determines that the new disk does not have any disk-specific number, the method further comprises the steps of:

formatting the new disk;

writing a new disk-specific number in said new disk; and writing the new disk-specific number with a name of the corresponding disk drive means in said set-up memory.

4. A mirror disk control method according to claim 2, wherein, when the step of identifying a new disk determines that the new disk has a disk-specific number, the method further comprises the step of changing the disk-specific number in said set-up memory previously registered as the disk-specific number of the disk in the disk drive means to the disk-specific number already written in the new disk.

5. A mirror disk control method according to claim 1, wherein the method further comprises the steps of:

checking a disk mounting state in each disk drive means when power is turned ON and starting a mirroring operation; and wherein the step of identifying a disk functioning as a master disk uses a master disk drive means name registered in said set-up memory.

6. A mirror disk device having two disk drive means in which two disks each allowing data to be read therefrom or data written thereto are positioned, respectively, and means for writing identical data in each of the two disks, said writing means comprising:

a set-up memory comprising a non-volatile memory in which disk-specific numbers corresponding to each of the two disks and a name of the disk drive functioning as a master drive are stored; and disk control means for generating disk-specific numbers without redundancy, writing a disk-specific number in a new disk positioned in one of said two disk drive means, and writing the disk-specific number with a disk-drive name related to the disk-specific number in said set-up memory, identifying a disk drive functioning as a master disk and writing the master disk drive name in said set-up memory;

wherein said disk control means has a switch which can be switched to any of a plurality of switching positions;

said disk control means discretely sets a range for a disk-specific number corresponding to a position of the switch without any conflict between said range and other ranges;

said disk control means decides a first disk-specific number within the range by means of a random function; and said disk control means assigns serial numbers subsequent to the first disk-specific number within the range as disk-specific numbers.

7. A mirror disk device according to claim 6, wherein said disk control means reads disk-specific numbers from disks installed in said disk drive means, compares each of the disk-specific numbers to a disk-specific number previously registered in said set-up memory as the disk-specific number of the disk in each of the respective disk drive means, and identifies a new disk as a disk not having a disk-specific number matching any of the previously registered disk-specific numbers.

8. A mirror disk device according to claim 7, wherein, said disk control means formats a new disk not having a disk-specific number, writes a new disk-specific number in said new disks, and writes the new disk-specific number with a name of a corresponding disk drive means in said set-up memory.

9. A mirror disk device according to claim 7, wherein, subsequent to said disk control means identifying a new disk which has a disk-specific number, said disk control means changes a disk-specific number previously registered as the disk-specific number of the disk in the corresponding disk drive means to the disk-specific number written in the new disk, and writes data stored on the other disk of said two disks to the new disk.

10. A mirror disk device according to claim 6, wherein said disk control means checks a mounting state of a disk in each disk drive means when power is turned ON, identifies a disk functioning as a master disk using a master disk drive means name registered in said set-up memory, and starts a mirroring operation.

11. A mirror disk device according to claim 10, wherein said disk control means reads disk-specific numbers from disks installed in said disk drive means, compares each disk-specific number with a disk-specific number previously registered in said set-up memory as the disk-specific number of the disk for each of the respective disk drive means;

identifies a new disk as a disk not having a disk-specific number matching any of the previously registered disk-specific numbers, and writes data stored in the other disk of the two disks to the new disk.

12. A mirror disk device according to claim 11, wherein, subsequent to said disk control means identifying a new disk which does not have a disk-specific number, said disk control means formats the new disk, writes a new disk-specific number in said new disk, writes the new disk-specific number with a name of a disk drive means corresponding to said new disk-specific number in said set-up memory, and writes data stored in the other disk of the two disks to the new disk.

13. A mirror disk device according to claim 11, wherein, subsequent to said disk control means identifying a new disk which has a disk-specific number, said disk control means changes a disk-specific number previously registered as the disk-specific number of the disk in the corresponding disk drive means to the disk-specific number written in the new disk, and writes data stored on the other disk of said two disks to the new disk.

* * * * *